United States Patent [19]

Sklebitz et al.

[11] Patent Number: 5,365,056
[45] Date of Patent: Nov. 15, 1994

[54] X-RAY IMAGE INTENSIFIER HAVING AN IMAGE SENSOR WITH AMORPHOUS SEMICONDUCTOR MATERIAL LAYER

[75] Inventors: Hartmut Sklebitz; Detlef Mattern; Martin Hoheisel, all of Erlangen, Germany

[73] Assignee: Siemens Aktiengesellschaft, Munich, Germany

[21] Appl. No.: 84,139

[22] Filed: Jul. 1, 1993

[30] Foreign Application Priority Data

Jul. 21, 1992 [DE] Germany ............... 4223693

[51] Int. Cl.$^5$ ............................................. H01J 40/14
[52] U.S. Cl. ............................ 250/214 VT; 313/526
[58] Field of Search .............. 250/214 VT, 370.89; 313/530, 537, 542, 526, 528; 378/98.2

[56] References Cited

U.S. PATENT DOCUMENTS

| | | |
|---|---|---|
| 4,740,824 | 4/1988 | Yano et al. |
| 5,117,114 | 5/1992 | Street et al. ............... 250/370.09 |
| 5,195,118 | 3/1993 | Nudelman et al. ............... 378/98.2 |

FOREIGN PATENT DOCUMENTS 0083240 7/1983 European Pat. Off. .

OTHER PUBLICATIONS

"Applications in Biology and Condensed Mtter Physics", Farugi, Nucl. Instr. and Meth, in Phys. Res., A310 (1991), pp. 14–23.

"Eletronenoptischer Röntgenbildverstärker-Kennwerte und Einsatz in der Röntgendiagnostik", Fenner, Siemens-Zeitschrift, vol. 41, No. 9 (1967), pp. 749–755.

Primary Examiner—David C. Nelms
Assistant Examiner—K. Shami
Attorney, Agent, or Firm—Hill, Steadman & Simpson

[57] ABSTRACT

The invention is directed to an x-ray image intensifier having an evacuated housing, an input luminescent screen, electron optics, and an image sensor applied inside the housing at that side thereof lying opposite the input luminescent screen. The side of the image sensor facing toward the input luminescent screen is provided with a layer system that includes at least one semiconductor layer that effects an electron conversion of the incident electrons by ionization with charge carrier multiplication and is composed of amorphous semiconductor material.

20 Claims, 2 Drawing Sheets

X-RAY IMAGE INTENSIFIER HAVING AN IMAGE SENSOR WITH AMORPHOUS SEMICONDUCTOR MATERIAL LAYER

BACKGROUND OF THE INVENTION

1. Field of the Invention

The present invention is directed to an x-ray image intensifier of the type having an evacuated housing, an input luminescent screen, electron optics and an image sensor attached inside the housing at that side lying opposite the input luminescent screen.

2. Description of the Prior Art

European Application 0 083 240 discloses an x-ray image intensifier of the type for use in x-ray examinations for medical diagnostics. The x-ray image intensifier supplies two-dimensional transillumination exposures in the form of video images. The x-ray quanta are absorbed in a scintillator of the input luminescent screen and are converted into light. The emitted light quanta release electrons in a photo-cathode of the input luminescent screen. These electrons are accelerated in the electrical field of the electron optics and are focused onto an image sensor, which converts the electron image into a video image and supplies corresponding video signals. Using such a known x-ray image intensifier, one directly obtains the electrical image signal for further processing in a digital image system or for video image display. Image sensors in the form of solid-state image pick-ups are usually based on the charge shift principle (CCD) and their standard embodiment is suitable for the documentation of photons in the visible range.

By contrast to photons, electrons leave effects along their entire path through the material. In the electron irradiation of a CCD from the front side, the extremely thin insulating layer would also be affected. This insulating layer, for example, can be composed of $SiO_2$ and separates the conductive shift structures (gates) from the semiconductor substrate. The demands made of this insulating layer are extremely high because of the high field strengths. Irradiations with charged particles, for example electrons, lead to the formation of quasi-stationary ions and, thus, to the formation of intermediate states (F centers) in the band gap of the $SiO_2$. These traps lead to an increased dark current and to a deterioration of the charge transfer efficiency. The charging affects also lead to a variation of the shift potential at the gates.

SUMMARY OF THE INVENTION

It is an object of the present invention to provide an x-ray image intensifier having a solid-state image sensor which enables a direct conversion of electrons, has a better rough contrast and wherein the CCD image converter is protected against electrons.

This object is achieved in an x-ray image intensifier constructed in accordance with the principles of the present invention wherein that side of the image sensor facing toward the input luminescent screen is provided with a layer system that includes at least one semiconductor layer that effects an electron conversion of the incident electrons by ionization with charge carrier multiplication, and which is composed of amorphous semiconductor material. This layer system serves the purpose of generating secondary electrons, transporting them to the electrodes, and blocking undesired charge carriers. The layer system also serves the purposes of shielding the image sensor against incident electrons and controlling the sensitivity of the entire arrangement by variation of externally supplied driving potentials.

Amorphous silicon, particularly hydrogen-containing, amorphous silicon that is manufactured according to a plasma CVD method, can be used in accordance with the invention as amorphous semiconductor material for the semiconductor layers. Selenium, compounds that contain selenium or amorphous carbon can, however, also be employed.

The semiconductor layer preferably has a thickness in the range from 1.5 $\mu$m through 50 $\mu$m particularly a thickness in the range from 2 $\mu$m through 20 $\mu$m, for electron conversion.

A good derivation of the electrons is obtained in an embodiment of the invention wherein a first electrode layer composed of an electrically conductive material having a high specific weight is applied on the image sensor, this first electrode layer being subdivided into individual image electrodes that are each conductively connected to respective storage diodes of the image elements of an inter-line transfer CCD image converter. A metal, for example platinum, tungsten or palladium, or a conductive oxide, for example indium-tin-oxide or zinc oxide, can be employed for the first electrode layer.

The layer system can form a PIN, MIS or Schottky diode. An advantageous structure of a PIN diode is achieved in an embodiment wherein the first electrode layer is covered by a first semiconductor layer having a first doping, the semiconductor layer for electron conversion has a thickness of $>2$ $\mu$m and is applied onto the first semiconductor layer, and a second semiconductor layer having a second doping is applied thereon, covered by an electrode layer. Preferably, the first doping can be a negative doping, for example phosphorus doping, and the second doping can be a positive doping, for example boron doping.

The efficiency of the layer system is enhanced when it is covered by a second electrode layer that is composed of an electrically conductive material with a low amount of plating or thickness of deposit. The metals aluminum, titanium or chronium and/or the oxides indium-tinoxide or zinc oxide can be employed as materials for this second electrode layer.

A Schottky diode can be used in the invention, in the form of a layer system that is covered by a second electrode layer that is composed of an electrically conductive material having a high electron work function or affinity for electrons. This material can be platinum, palladium, gold or indium-tin-oxide.

If a MIS diode is used in the invention, the semiconductor layers can be composed of amorphous semiconductor alloys that contain at least one of the elements from the group of silicon, nitrogen, oxygen, carbon, selenium and hydrogen.

Preferably, the semiconductor layers limiting the semiconductor layer for electron conversion has a thickness in the range from 10 nm through 100 nm.

A driving potential (extraction voltage) can be applied to the layer system by applying a bias that lies in the range from $>0$ V through 1,000 V, preferably up to 200 V, to the electrode layers. The sensitivity can be varied when the bias voltage is made adjustable.

This arrangement yields an x-ray image intensifier with an image sensor wherein an intermediate step necessary in conventional x-ray image intensifiers—the conversion of the electron beam image into a visible image—can be omitted. As a result, a phosphor layer can be saved. The electrons are kept away from the CCD image converter by the thick electron converter layer and by the electrode layers.

DESCRIPTION OF THE PREFERRED EMBODIMENTS

Figure 1:
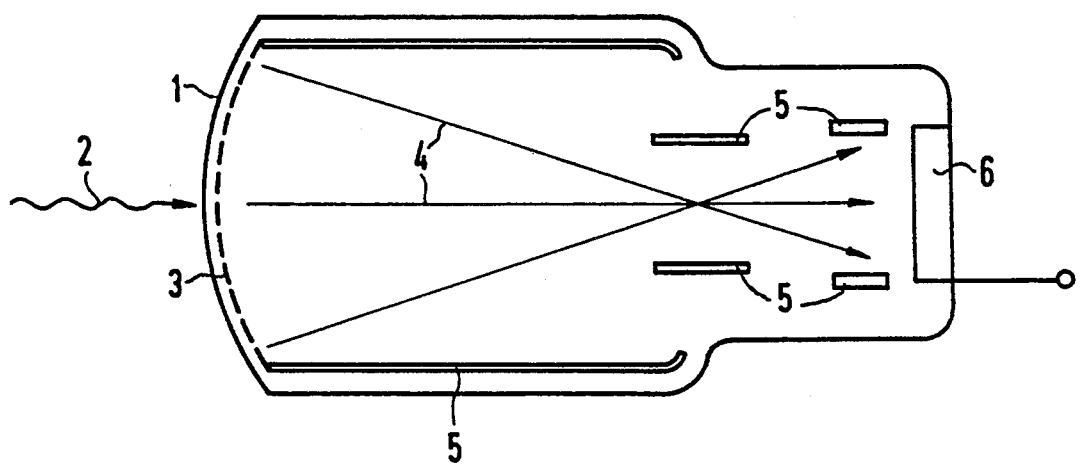
FIG. 1 shows an x-ray image intensifier having an image sensor.

FIG. 1 shows an x-ray image intensifier having an evacuated housing 1. At that side facing toward the x-rays 2, the x-ray image intensifier has an input luminescent screen 3 in the interior of the housing 1. This input luminescent screen 3 contains a phosphor layer applied on a photo-cathode. The electrons 4 emanating from the photocathode are accelerated and focused onto an image sensor 6 by electron optics 5. This image sensor 6 converts the incident electrons 4 into an electrical signal that is further processed as a video signal and is reproduced on a monitor.

Figure 2:
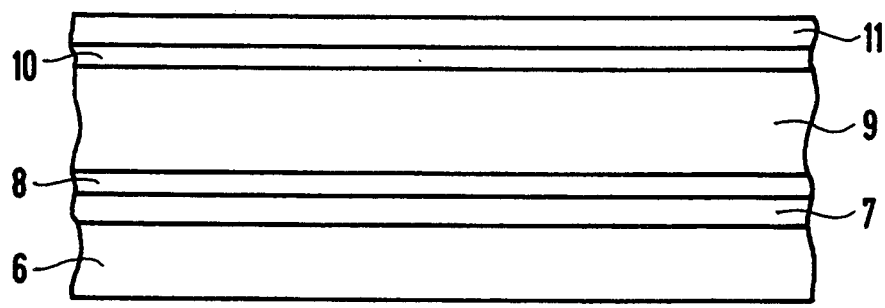
FIG. 2 is a schematic section through a CCD converter constructed in accordance with the principles of the present invention in an embodiment having a PIN diode.

FIG. 2 shows a section through the overall image converter of the invention. A first, electrically conductive electrode layer 7, for example of indium-tin-oxide (ITO) or tungsten (W), is applied as an image element electrode on the CCD converter as a substrate 6. Three semiconductor layers 8 through 10 composed of an amorphous semiconductor, preferably amorphous hydrogen-containing silicon (aSi:H) are applied on this electrode. Selenium, compounds that contain selenium, or amorphous carbon can alternatively be employed.

The first layer 8 is negatively doped, for example by adding 0.1% through 10% phosphine (PH$_3$) in the manufacture of this layer, and has a thickness of 20 nm through 100 nm. The second layer 9 is undoped and has a thickness of 2 $\mu$m through 50 $\mu$m, preferably 3 $\mu$m through 20 $\mu$m. The third layer 10 is positively doped, for example by adding 0.1% through 10% diborane (B$_2$H$_6$) in the manufacture of this layer, and has a thickness of 10 nm through 50 nm. An electrically conductive, second electrode layer 11, through which the incident electrodes penetrate into the semiconductor layer 9, is applied on the semiconductor layers 8 through 10. This layer 11 is preferably composed of a metal layer having low density, for example aluminum (Al) or titanium (Ti), and has a thickness of 10 nm through 200 nm. The layers 7 through 11 form a PIN diode.

The extremely high-energy, incident electrodes effect an ionization in the semiconductor layers, so that a charge multiplication or charge carrier multiplication is achieved, for example by a factor of 100. As a result of the arrangement of the semiconductor layers of amorphous silicon on the front side of a CCD image converter where the transport regions lie, a high efficiency of the charge carrier multiplication is obtained.

Figure 3:
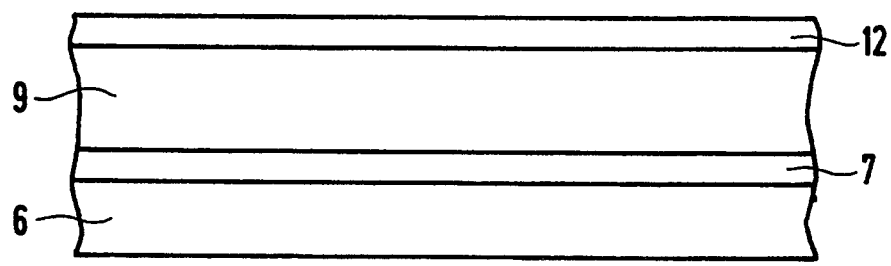
FIG. 3 is a schematic section through a CCD converter constructed in accordance with the principles of the present invention in an embodiment having a Schottky diode.

FIG. 3 shows a section through another embodiment of the image converter of the invention. In FIG. 2, a first electrode layer 7 is applied on the CCD converter as a substrate 6. An undoped semiconductor layer 9 composed of an amorphous semiconductor, preferably hydrogen-doped, amorphous silicon (aSi:H), is applied on this electrode layer 7. A second electrode layer 12 is applied on this semiconductor layer 9, the second electrode layer 12 having a high electron affinity for electrons and being preferably composed of a metal such as platinum (Pt), palladium (Pd) or gold (Au) or of indium-tin-oxide (ITO). This electron layer 12: is preferably 10 nm through 100 nm thick. The layers 7, 9 and 12 form a Schottky diode.

Figure 4:
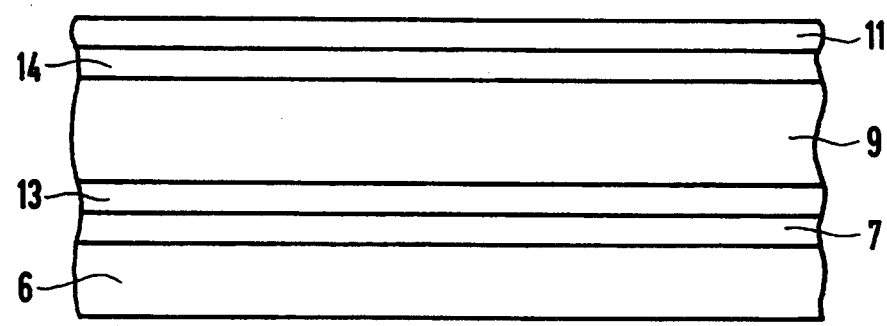
FIG. 4 is a schematic section through a CCD converter constructed in accordance with the principles of the present invention in an embodiment having a MIS diode arrangement.

FIG. 4 shows a section through a further embodiment of the image converter of the invention. A first electrode layer 7 is again applied on the CCD converter as substrate 6. A first blocking layer 13, composed of an amorphous semiconductor alloy, is applied on this electrode layer 7. This first blocking layer 13 is preferably composed of amorphous, hydrogen-containing silicon with the addition of elements from the group of nitrogen (N), oxygen (O) or carbon (C), and is 10 nm through 50 nm thick. A semiconductor layer 9 that is undoped or lightly doped and has a thickness of 1.5 $\mu$m through 50 $\mu$m, preferably from 3 $\mu$m through 20 $\mu$m, is applied on the blocking layer 13. A second blocking layer 14 that is composed of amorphous silicon nitride, silicon oxide, silicon oxinitride, or an alloy of these substances with carbon and hydrogen, and is 10 nm through 50 nm thick, is applied on the semiconductor layer 9. An electrode layer 11 that is preferably composed of a metal layer having low density, for example aluminum (Al) or titanium (Ti), and a thickness of 10 nm through 200 nm, is applied on the second blocking layer 14. The layers 7, 9, 11, 13 and 14 form a MIS diode.

The electrons 4 incident on the layer system 7 through 14 of FIGS. 2 through 4 produce numerous electron-hole pairs within the semiconductor layer 9. These electron-hole pairs can either recombine, or are separated by a voltage applied between the electrode layers 7 and 11 (or 12), and are further processed in the CCD. The proportion of these separated electron-hole pairs can be defined by the height of the applied voltage. As a result, the sensitivity of the entire x-ray image intensifier/image sensor system can be set. An overdrive of the CCD image converter is thereby prevented, The image sensor of the invention can be unproblematicaily introduced in an x-ray image intensifier. Layers can be saved (omitted), for example an opto-electrical conversion layer as well as protective layer for the CCD image converter. The driving potential (extraction voltage) can be varied better and over a greater range due to the increased thickness.

Although modifications and changes may be suggested by those skilled in the art, it is the intention of the inventors to embody within the patent warranted hereon all changes and modifications as reasonably and properly come within the scope of their contribution to the art.

We claim as our invention:

1. An x-ray image intensifier comprising:
   an evacuated housing containing an input luminescent screen which generates electrons as a result of x-rays incident on said input luminescent screen;
   electron optics for focusing said electrons, an image sensor onto which the electrons focused by said electron optics are incident, disposed in said housing at a side of said housing opposite said input luminescent screen; and a layer system disposed on a side of said image sensor facing toward said input luminescent screen, said layer system including at least one semiconductor layer consisting of material for effecting an electron conversion of said electrons by ionization with charge carrier multiplication, said at least one semiconductor layer being comprised of amorphous semiconductor material.

2. An x-ray image intensifier as claimed in claim 1 wherein said at least one semiconductor layer contains amorphous silicon.

3. An x-ray image intensifier as claimed in claim 1 wherein said at least one semiconductor layer comprises hydrogen-doped amorphous silicon.

4. An x-ray image intensifier as claimed in claim 1 wherein said at least one semiconductor layer has a thickness in a range from 1.5 µm through 50 µm.

5. An x-ray image intensifier as claimed in claim 1 wherein said at least one semiconductor layer has a thickness in the range from 2 µm through 20 µm.

6. An x-ray image intensifier as claimed in claim 1 wherein said image sensor is an interline transfer CCD image converter having a plurality of image elements, each image element having a storage diode associated therewith, and wherein said layer system includes a first electrode layer consisting of an electrically conductive material having a high specific weight, said first electrode layer being subdivided into a plurality of individual image element electrodes forming said image elements of said CCD image converter and respectively electrically connected to said storage diodes.

7. An x-ray image intensifier as claimed in claim 6 wherein said first electrode layer consists of at least one material selected from the group of metals consisting of platinum, tungsten and palladium and the group of conductive oxides consisting of indium-tin-oxide and zinc oxide.

8. An x-ray image intensifier as claimed in claim 1 wherein said layer system forms a PIN diode.

9. An x-ray image intensifier as claimed in claim 1 wherein said layer system forms an MIS diode.

10. An x-ray image intensifier as claimed in claim 1 wherein said layer system forms a Schottky diode.

11. An x-ray image intensifier as claimed in claim 1 wherein said layer system further includes a first semiconductor layer covering said first electrode layer and having a doping of a first type, said first semiconductor layer having a thickness of greater than 2 µm, and said layer system further including a second semiconductor layer having a second doping type applied on said first electrode layer and covered by said first electrode layer.

12. An x-ray image intensifier as claimed in claim 1 further comprising a second electrode layer covering said layer system, said second electrode layer being composed of an electrically conductive material having a low amount of plating.

13. An x-ray image intensifier as claimed in claim 12 wherein said second electrode layer is composed of at least one material selected from the group of metals consisting of aluminum, titanium and chromium and the group of conductive oxides consisting of indium-tin-oxide and zinc oxide.

14. An x-ray image intensifier as claimed in claim 10 further comprising a second electrode layer covering said layer system, said second electrode layer being composed of an electrically conductive material having a high electron work function.

15. An x-ray image intensifier as claimed in claim 14 wherein said second electrode layer consists of at least one material from the group of metals consisting of platinum, palladium and gold, and of indium-tin-oxide.

16. An x-ray image intensifier as claimed in claim 9 wherein said at least one semiconductor layer is composed of an amorphous semiconductor alloy containing at least one of the elements selected from the group consisting of silicon, nitrogen, oxygen, carbon, selenium and hydrogen.

17. An x-ray image intensifier as claimed in claim 1 wherein said at least one semiconductor layer has a thickness in the range of from 10 nm through 100 nm.

18. An x-ray image intensifier as claimed in claim 1 wherein said layer system includes an electrode layer, and wherein said x-ray image intensifier further comprises means for applying an electrical bias to said electrode layer in the range of from $>0$ V through 1000 V.

19. An x-ray image intensifier as claimed in claim 18 wherein said means for applying said electrical bias comprises means for applying an electrical bias in the range of from $>0$ V through 200 V.

20. An x-ray image intensifier as claimed in claim 19 wherein said means for applying said electrical bias comprises variable means for applying an electrical bias.

* * * * *